United States Patent
O'Loughlin et al.

(10) Patent No.: US 7,230,274 B2
(45) Date of Patent: Jun. 12, 2007

(54) REDUCTION OF CARROT DEFECTS IN SILICON CARBIDE EPITAXY

(75) Inventors: Michael John O'Loughlin, Chapel Hill, NC (US); Joseph John Sumakeris, Apex, NC (US)

(73) Assignee: Cree, Inc, Durham, NC (US)

( * ) Notice: Subject to any disclaimer, the term of this patent is extended or adjusted under 35 U.S.C. 154(b) by 317 days.

(21) Appl. No.: 10/790,406

(22) Filed: Mar. 1, 2004

(65) Prior Publication Data

US 2007/0108450 A1    May 17, 2007

(51) Int. Cl.
*H01L 29/15* (2006.01)
*H01L 29/06* (2006.01)

(52) U.S. Cl. .................. 257/77; 257/618; 257/619
(58) Field of Classification Search ............... None
See application file for complete search history.

(56) References Cited

U.S. PATENT DOCUMENTS

| | | | | |
|---|---|---|---|---|
| 5,248,385 | A | * | 9/1993 | Powell .................. 438/507 |
| 5,363,800 | A | * | 11/1994 | Larkin et al. .............. 438/507 |
| 6,956,239 | B2 | * | 10/2005 | Sriram ................... 257/77 |
| 2002/0059898 | A1 | * | 5/2002 | Landini et al. .............. 117/84 |
| 2003/0079689 | A1 | | 5/2003 | Sumakeris et al. |
| 2005/0064723 | A1 | | 3/2005 | Sumakeris |
| 2006/0125057 | A1 | * | 6/2006 | Di Cioccio et al. ......... 257/619 |

FOREIGN PATENT DOCUMENTS

JP    2000-053498    2/2000
WO    WO 97/01658    1/1997

OTHER PUBLICATIONS

Ellison et al. "Epitaxial Growth of SiC in a Chimney CVD Reactor" *Journal of Crystal Growth* 236: 225-238 (2002).
International Search Report and the Written Opinion of the International Searching Authority for International patent application No. PCT/US2004/038895 mailed on Jun. 1, 2005.
Kimoto et al. "Homoepitaxial Growth of 4H-SiC(0 3 3 8) and Nitrogen Doping by Chemical Vapor Deposition" *Journal of Crystal Growth* 249: 208-215 (2003).

(Continued)

*Primary Examiner*—Duy-Vu N. Deo
(74) *Attorney, Agent, or Firm*—Myers Bigel Sibley & Sajovec, PA

(57) ABSTRACT

Single crystal silicon carbide epitaxial layer on an off-axis substrate are manufactured by placing the substrate in an epitaxial growth reactor, growing a first layer of epitaxial silicon carbide on the substrate, interrupting the growth of the first layer of epitaxial silicon carbide, etching the first layer of epitaxial silicon carbide to reduce the thickness of the first layer, and regrowing a second layer of epitaxial silicon carbide on the first layer of epitaxial silicon carbide. Carrot defects may be terminated by the process of interrupting the epitaxial growth process, etching the grown layer and regrowing a second layer of epitaxial silicon carbide. The growth interruption/etching/regrowth may be repeated multiple times. A silicon carbide epitaxial layer has at least one carrot defect that is terminated within the epitaxial layer. A semiconductor structure includes an epitaxial layer of silicon carbide on an off-axis silicon carbide substrate, and a carrot defect having a nucleation point in the vicinity of an interface between the substrate and the epitaxial layer and is terminated within the epitaxial layer.

9 Claims, 6 Drawing Sheets

OTHER PUBLICATIONS

Konstantinov et al. "The Mechanism for Cubic SiC Formation on Off-Oriented Substrates" *Journal of Crystal Growth* 178: 495-504 (1997).

Mills "Wide Bandgaps Show Power Pedigree in San Francisco" *Meeting Report* 11(5): 46-51 (1998).

Nakazawa et al. "High-purity 4H-Sic Epitaxial Growth by Hot-Wall Chemical Vapor Deposition" *Journal of Crystal Growth* 237-239: 1213-1218 (2002).

Okada et al. "Correspondence Between Surface Morphological Faults And Crystallographic Defects in 4H-SiC Homoepitaxial Film" *Jpn J Appl Physics* 41: 6320-6326 (2002).

Wahab et al. "Influence of Epitaxial Growth and Substrate-Induced Defects on the Breakdown of 4H-SiC Schottky Diodes" *Applied Physics Letters* 76(19): 2725-2727 (2000).

Okada et al. "Crystallographic defects under surface morphological defects of 4H-SiC homoepitaxial films," ICSCRM 2003 Poster Sessions.

Wahab et al. "Influence of epitaxial growth and substrate-induced defects on the breakdown of 4H-SiC Schottky diodes," *Applied Physics Letters*, vol. 76, No. 19, May 8, 2000, pp. 2725-2727.

U.S. Appl. No. 10/414,787, entitled *Methods and Apparatus for Controlling Formation of Deposits in a Deposition System and Depositions Systems and Methods Including the Same*, filed Apr. 16, 2003.

U.S. Appl. No. 09/756,548, titled *Gas Driven Rotation Apparatus and Method for Forming Silicon Carbide Layers*, filed Jan. 8, 2001.

U.S. Appl. No. 10/117,858, titled *Gas Driven Planetary Rotation Apparatus and Methods for Forming Silicon Carbide Layers*, filed Apr. 8, 2002.

\* cited by examiner

REDUCTION OF CARROT DEFECTS IN SILICON CARBIDE EPITAXY

STATEMENT OF GOVERNMENT SUPPORT

The present invention was made, at least in part, with government support under Office of Naval Research Contract No. N00014-02-C-0302. The United States government has certain rights to this invention.

FIELD OF THE INVENTION

The present invention relates to epitaxial deposition processes and, more particularly, to methods for depositing an epitaxial film of silicon carbide on a substrate and resulting epitaxial structures.

BACKGROUND OF THE INVENTION

Deposition systems and methods are commonly used to form layers of semiconductor materials, such as thin epitaxial films, on substrates. For example, a chemical vapor deposition (CVD) reactor system and process may be used to form a layer of semiconductor material such as silicon carbide (SiC) on a substrate. CVD processes may be particularly effective for forming layers with controlled properties, thicknesses, and/or arrangements such as epitaxial layers. Typically, in a deposition system, such as a CVD system, the substrate is placed in a reaction chamber within a susceptor and one or more process gases including reagents or reactants to be deposited on the substrate are introduced into the chamber adjacent the substrate. The process gases may be flowed through the reaction chamber in order to provide a uniform or controlled concentration of the reagents or reactants to the substrate.

A deposition system, such as a CVD reactor, may be used to form epitaxial layers of silicon carbide on a single crystal silicon carbide substrate having a predetermined polytype such as 2H, 4H, 6H, 15R, 3C and the like. The term "polytype" refers to the ordering and arrangement of layers of atoms within a crystal structure. Thus, although the different polytypes of silicon carbide are stoichiometrically identical, they possess different crystal structures and consequently have different material properties such as carrier mobility and breakdown field strength. The letters H, R and C refer to the general crystal structure of the polytype, namely, hexagonal, rhombohedral and cubic, respectively. The numbers in the polytype designations refer to the repetition period of layer arrangements. Thus, a 4H crystal has a hexagonal crystal structure in which the arrangement of atoms in a crystal repeats every four bi-layers.

FIG. 9 illustrates a hexagonal unit cell of a hypothetical crystal. The unit cell 60 includes a pair of opposing hexagonal faces 61A, 61B. The hexagonal faces are normal to the c-axis, which runs along the [0001] direction as defined by the Miller-Bravais indexing system for designating directions in a hexagonal crystal. Accordingly the hexagonal faces are sometimes called the c-faces which define the c-planes or basal planes of the crystal. Planes which are perpendicular to the c-plane are referred to as prismatic planes.

Silicon carbide possesses a number of advantageous physical and electronic characteristics for semiconductor performance and devices. These include a wide bandgap, high thermal conductivity, high saturated electron drift velocity, high electron mobility, superior mechanical strength, and radiation hardness. However, the presence of crystalline defects in silicon carbide films may limit the performance of electronic devices fabricated in the films, depending on the type, location, and density of the defects. Accordingly, significant research has focused on reducing defects in silicon carbide films. Certain defects, such as micropipes, are known to severely limit and even prevent device performance. Other defects, such as threading defects, are not considered to be electrically active, and therefore may not be detrimental to device performance, at densities normally found in epitaxial films.

For applications where a high voltage blocking capability is required (for example power switching applications), silicon carbide films are usually grown "off-axis." That is, the substrate crystal is sliced at an angle that is slightly oblique to the normal crystal axis (called the c-axis). Taking for example a hexagonal polytype such as 4H or 6H, the oblique angle of the cut may be made in one of the standard crystallographic directions illustrated in FIG. 10, namely the [11$\bar{2}$0] direction (towards a point of the hexagonal unit cell) or [10$\bar{1}$0] direction (towards the center of a flat side of the hexagonal unit cell), or along a different direction.

Thus when an epitaxial layer is grown on the substrate, the deposited atoms bond to atoms at the exposed edges of the crystal layer steps, which causes the steps to grow laterally in so-called step-flow fashion. Step-flow growth is illustrated in FIG. 11. Each layer or step grows in the direction in which the crystal was originally cut off-axis (the [11$\bar{2}$0] direction in the case illustrated in FIG. 11).

Surface morphological defects, i.e. defects in the shape of the surface of an epitaxial film, have been observed in silicon carbide epitaxial layers using conventional imaging techniques such as Transmission Electron Microscopy (TEM) and Nomarski microscopy. Surface morphological defects are generally considered to be caused by crystallographic defects in the material. Accordingly, research into the cause of surface morphological defects generally focuses on the physics of crystal growth.

Surface morphological defects are generally classified in accordance with their physical appearance. Thus, such defects have been classified as "comet", "carrot" and "triangular" defects based on their appearance under a microscope. Carrot defects are roughly carrot-shaped features in the surface of the silicon carbide film. The features are aligned along the step flow direction of the film, and are characteristically longer than the depth of the layer in which they are formed. For example, a film having a thickness of 40 μm may contain carrot defects having a length of around 250 μm depending on the off-axis angle. The mechanism by which carrot defects form is currently unknown. Wahab et al. speculate that carrot defects are caused by perfect screw dislocations which are pinned to the surface of the substrate during growth, and that the dislocation dissociates into partials that propagate in the basal plane and form partial ledges in the film. Wahab et al., "Influence of epitaxial growth and substrate induced defects on the breakdown of 4H—SiC Schottky diodes," Appl. Phys. Let. Vol. 76 no. 19, pp. 2725–2727 (2000). While Wahab et al. reported that carrot defects were not harmful to the absolute breakdown voltage of Schottky diodes, reverse leakage current was increased by the presence of carrot defects. Carrot defects may have deleterious effects on other device properties as well, particularly when the defect is located at a sensitive location, such as under the edge of a Schottky contact.

Thus, it would be desirable to reduce or minimize the concentration of carrot defects found in epitaxial films of silicon carbide.

SUMMARY OF THE INVENTION

Some embodiments of the present invention, provide for manufacturing a single crystal silicon carbide epitaxial layer on an off-axis substrate by placing the substrate in an epitaxial growth reactor, growing a first layer of epitaxial silicon carbide on the substrate, interrupting the growth of the first layer of epitaxial silicon carbide, etching the first layer of epitaxial silicon carbide to reduce the thickness of the first layer, and growing a second layer of epitaxial silicon carbide on the first layer of epitaxial silicon carbide. Growing a first layer of epitaxial silicon carbide may include flowing silicon and carbon containing source gases over the substrate. Interrupting the growth of the first layer of epitaxial silicon carbide may include halting and/or reducing the flow of the source gases. Etching the first layer of epitaxial silicon carbide may include flowing an etchant gas such as $H_2$, HCl, Ar, $Cl_2$ and/or a carbon-containing gas such as propane over the substrate. Carrot defects which originate at the substrate/epitaxy interface may be terminated by the process of interrupting the epitaxial growth process, etching the grown layer and regrowing a second layer of epitaxial silicon carbide. The process of growth interruption/etching/growth may be repeated multiple times.

In certain embodiments of the present invention, a silicon carbide epitaxial layer having at least one carrot defect that is terminated within the epitaxial layer is provided.

Further embodiments of the invention provide a semiconductor structure that includes an off-axis silicon carbide substrate, an epitaxial layer of silicon carbide on the substrate, and a carrot defect having a nucleation point in the vicinity of an interface between the substrate and the epitaxial layer, wherein the carrot defect is terminated within the epitaxial layer.

DETAILED DESCRIPTION OF THE PREFERRED EMBODIMENTS

Figure 1:
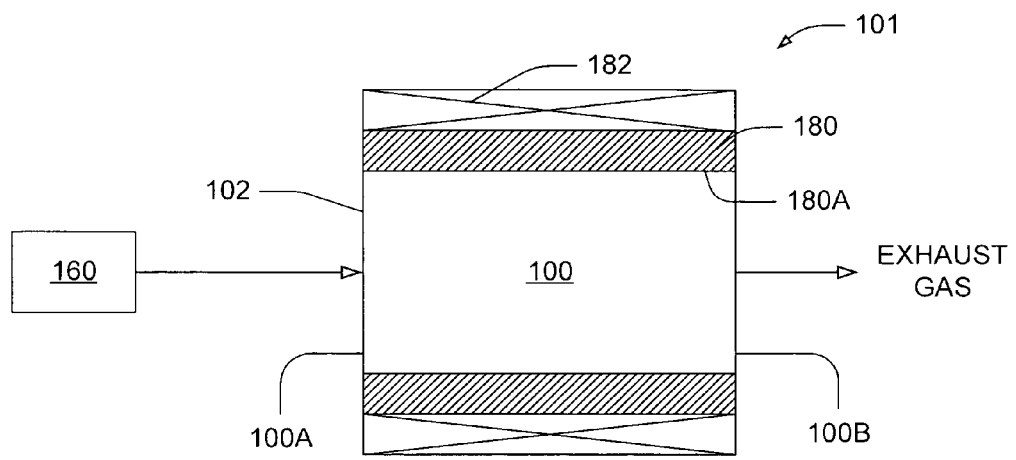
FIG. 1 is a schematic view of a deposition system according to some embodiments of the present invention.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions or layers may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Like numbers refer to like elements. As used herein the term "and/or" includes any and all combinations of one or more of the associated listed items.

It will be understood that although the terms first and second may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first region, layer, or section discussed below could be termed a second region, layer, or section, and similarly, a second without departing from the teachings of the present invention.

Figure 2:
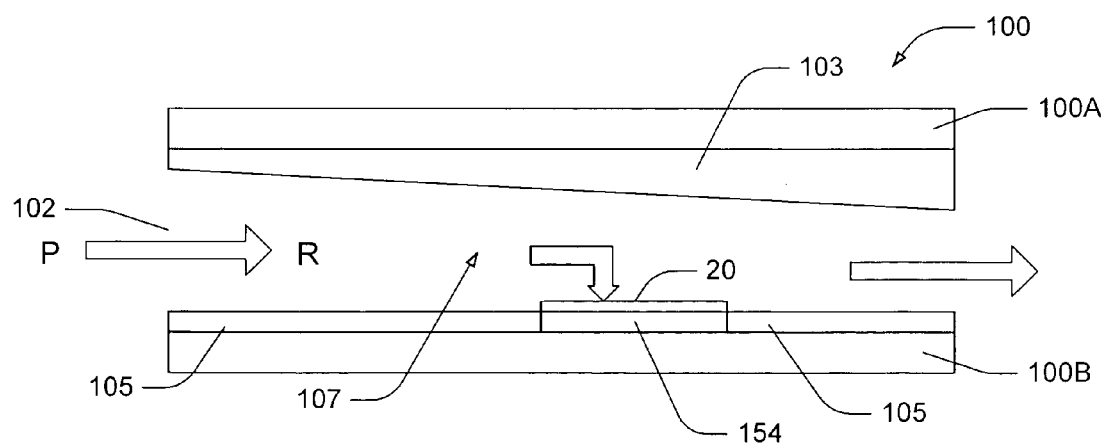
FIG. 2 is a cross section of a susceptor assembly forming a part of the deposition system of FIG. 1.

A deposition system 101 in which embodiments of the present invention may be practiced is schematically shown in plan view in FIG. 1. The deposition system 101 may be a horizontal, hot wall, flow through, CVD system as shown including a susceptor assembly 100, a quartz tube 180 defining a through passage 180A, an electromagnetic frequency (EMF) generator 182 (for example, including a power supply and an RF coil surrounding the tube 180) and a process gas supply 160. An insulative cover may be provided about the susceptor assembly 100 in addition to or in place of the quartz tube 180. The deposition system 101 may be used to form a layer or film on a substrate 20 (FIG. 2). While only a single substrate 20 is illustrated in FIG. 2, the system 101 may be adapted to form films concurrently on multiple substrates 20.

The substrate 20 may be a wafer or other structure formed of the same or a different material than that of the layer to be deposited. The substrate 20 may be formed of, for example, SiC, sapphire, a Group III nitride, silicon, germanium, and/or a III–V or II–VI compound or interalloy, or the like. The substrate surface upon which the film is deposited may be a base substrate or a first or subsequent layer superimposed on a base substrate. For example, the surface of the substrate 20 for receiving the deposited film may be a layer previously deposited using the deposition system 101 or an alternative apparatus. As will be appreciated by those of skill in the art in light of the present disclosure, embodiments of the present invention may be advantageously utilized with semiconductor materials other than those specifically mentioned herein.

Generally, the process gas supply 160 supplies a process gas into and through the susceptor assembly 100 as discussed below. The EMF generator 182 inductively heats the susceptor assembly 100 to provide a hot zone in the susceptor assembly 100 where deposition reactions take place. The process gas continues through and out of the susceptor assembly 100 as an exhaust gas that may include remaining components of the process gas as well as reaction by-products, for example. Embodiments of the present invention may be used in types of deposition systems other than hot wall CVD systems. Other modifications to the systems and methods of the present invention will be apparent to those of ordinary skill in the art upon reading the description herein.

The process gas includes one or more components such as reagents, reactants, species, carriers and the like. Where it is desired to forming a SiC layer on a substrate, the process gas may include precursor gases such as silane ($SiH_4$) and propane ($C_3H_8$) along with a carrier gas such as purified hydrogen gas ($H_2$). The process gas supply 160 may be provided from one or more pressurized containers of the gases with flow control and/or metering devices as needed.

An exemplary conventional susceptor 100 is shown in FIG. 2. The susceptor 100 may be used, for example, in a flow through, hot wall, CVD reactor. The susceptor 100 has a top susceptor member 100A and a bottom susceptor member 100B. The susceptor 100 also has a top liner 103 and a bottom liner 105 defining a reaction chamber 107 therebetween. A substrate 20, such as a semiconductor wafer, is positioned in the reaction chamber 107 and may be situated on an interior surface of a platter (which may rotate), for example. A process gas P is introduced to the reaction chamber 107 at one end, flowed through the reaction chamber 107 past the substrate 20, and finally exhausted from the reaction chamber 107 at the opposite end. As used herein, the term process gas refers to one or more gases. As indicated by the arrows in the reaction chamber 107 as shown in FIG. 2, as the process gas flows through the reaction chamber 107 a portion of the process gas may contact the substrate 20 as intended and thereby deposit the reagents or reactants on the substrate 20 to form a layer thereon. In some systems, the reaction chamber 107 may have a length of between about 0.1 and 1 meter, a width of between about 0.05 and 0.5 meter, and a height of between about 1 and 10 cm. The reaction chamber 107 is not limited to these dimensions, however. The susceptor members may include high quality graphite. Examples of CVD deposition systems including improved susceptor designs are found in U.S. Patent Publication No. US 2003/0079689 entitled "Induction Heating Devices and Methods for Controllably Heating an Article" and U.S. patent application Ser. No. 10/414,787 entitled "Methods and Apparatus for Controlling Formation of Deposits in a Deposition System and Depositions Systems and Methods Including the Same" both of which are incorporated herein by reference in their entireties.

In certain embodiments, the susceptor members 100A, 100B are formed of a material suitable to generate heat responsive to eddy currents generated therein by the EMF generator 182, such materials and inductive heating arrangements being well known to those of skill in the art. The members may be formed of graphite, and more preferably of high purity graphite.

A platter 154 or the like may be situated between the bottom member 100B and the substrate 20 to support the substrate 20. According to some embodiments, the platter 154 may be rotatively driven by a suitable mechanism (not shown). For example, the system may include a gas-driven rotation system as described in Applicant's U.S. application Ser. No. 09/756,548, titled Gas Driven Rotation Apparatus and Method for Forming Silicon Carbide Layers, filed Jan. 8, 2001, and/or as described in Applicant's U.S. application Ser. No. 10/117,858, titled Gas Driven Planetary Rotation Apparatus and Methods for Forming Silicon Carbide Layers, filed Apr. 8, 2002, the disclosures of which are hereby incorporated herein by reference in their entireties. Alternatively, the platter 154 may be stationary. The platter 154 may be adapted to hold one or multiple substrates 20. The platter 154 may be formed of any suitable material such as SiC coated graphite, solid SiC and/or solid SiC alloy. The platter 154 may be omitted such that the substrate rests on the bottom member 140, the liner 105, or other suitable support.

In use, the process gas supply 160 supplies a flow of the process gas P to the reaction chamber 107 through the inlet opening 102. The process gas P flows generally in a flow direction R. As shown, some portion of the process gas and the reagents therein contact the substrate 20 to form the desired layer (e.g., an epilayer) on the exposed surface of the substrate 20.

While the foregoing deposition system 101 and methods are described as relating to a horizontal, hot wall, CVD, flow through deposition process, various aspects of the present invention may be used in other types of deposition systems and processes. While particular embodiments have been described with reference to "top", "bottom" and the like, other orientations and configurations may be employed in accordance with the invention. For example, the deposition system and process may be a cold wall and/or non-horizontal flow through system and process. The deposition system and process may be a vapor phase epitaxy (VPE), liquid phase epitaxy (LPE), or plasma enhanced CVD (PECVD) deposition system and process rather than a CVD system or process.

Figure 3:
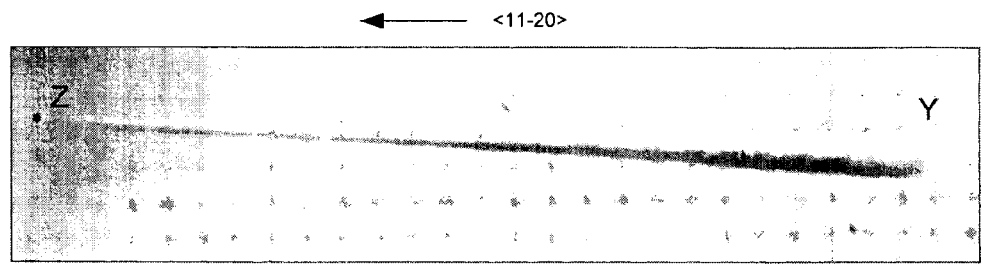
FIG. 3 is a plan view of a carrot defect in a silicon carbide epitaxial layer.

As discussed above, surface morphological defects known as carrot defects may form in silicon carbide epitaxial films. FIG. 3 is an optical image showing a carrot defect in a silicon carbide epitaxial layer. The defect appears as a carrot-shaped ridge in the surface of the material. Although the precise mechanism is unknown, it is presently believed that most, if not all, carrot defects form at the interface between the substrate and the epitaxial layers and then propagate through epitaxial growth. Okada et al. report that carrot defects are characterized by several sets of stacking faults on the (0001) plane at their termination, and observed partial dislocations bounding the stacking faults. Okada et al., "Crystallographic defects under surface morphological defects of 4H—SiC homoepitaxial films," ICSCRM 2003 Poster Session. The inventors have found that carrot defects tend to form at or near regions in which a high density of threading dislocations is present, such as may be present at the interface between a crystal substrate and an epitaxial layer. Carrot defects appear to propagate as stacking faults in prismatic planes which grow in stepwise fashion in the direction of the crystal off-cut. Viewed from the side, the defects appear as triangular stacking faults having a vertex at the substrate/epitaxy interface and an opposite side on the growth surface.

Figure 4:
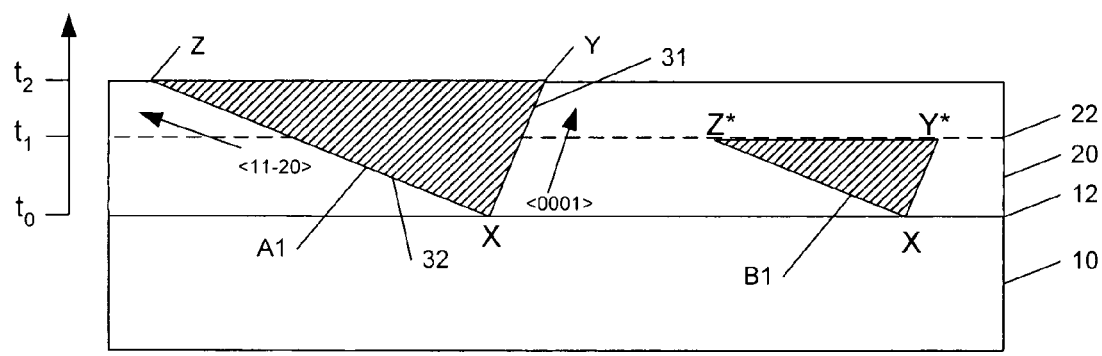
FIG. 4 is a schematic side view of carrot defects formed in a silicon carbide epitaxial layer.

The formation of carrot defects is illustrated schematically in FIG. 4, which shows a substrate 10 on which an epitaxial layer 20 has been formed. Carrot defects A1 and B1 are present in the epitaxial layer 20. As the time scale adjacent the figure indicates, epitaxial growth of layer 20 is initiated at time to and terminated at time $t_2$. Carrot defect A1 nucleates at point X at the interface 12 and propagates upward as the epitaxial layer 20 grows. As illustrated in FIG. 4, carrot defect A1 is bounded on one side by a threading dislocation 31 in the [0001] direction and by a basal plane dislocation 32 aligned in the [11$\bar{2}$0] direction. When the epitaxial growth is terminated at time $t_2$, the carrot defect extends along the surface of the epitaxial layer 20 from point Y to point Z. For ease of reference, the corresponding endpoints Y and Z are labeled on the defect shown in FIG. 3.

Figure 11:
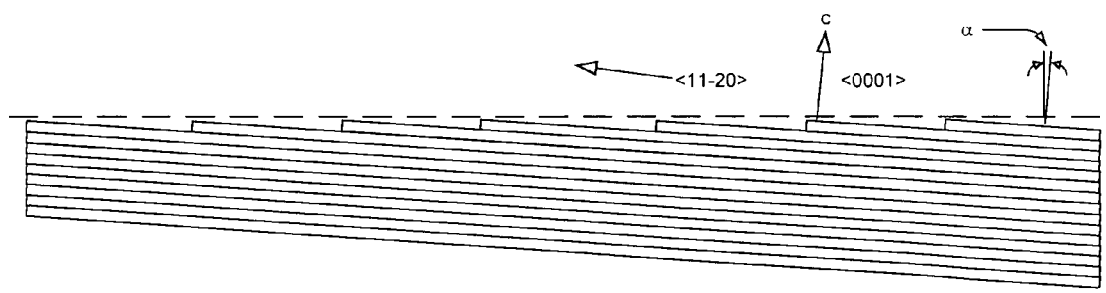
FIG. 11 is a schematic side view of an off-axis silicon carbide crystal.

As seen in FIG. 4, the length of the surface feature of the carrot defect is related to the thickness of the epitaxial layer and the off-axis angle α illustrated in FIG. 11. In fact, the length of a carrot defect in the growth plane is inversely proportional to the tangent of the off-axis angle α.

In typical epitaxial growth systems that do not utilize the present invention, it is common to have a density of carrot defects in excess of 2.5 per square centimeter. The inventors have discovered that the density of carrot defects in an epitaxial layer of silicon carbide may be reduced by arresting the propagation of such defects during epitaxial growth. According to some embodiments of the present invention, propagation of carrot defects may be arrested by halting and/or reducing the flow of silicon and carbon source gases during normal epitaxial growth, etching a predetermined thickness of the grown epitaxial layer and resuming the flow of silicon and carbon source gases to resume growth of the epitaxial layer to the desired ultimate thickness. The process of etching and growing silicon carbide may be performed once or may be repeated multiple times.

When the flow of reaction gases is halted, the carrier or other gases still flowing tend to etch the epilayers that have been grown on the substrate 20. Additionally, etchant gases may be introduced into the reaction chamber during the growth interruption. Accordingly, the process according to embodiments of the present invention may be carried out in-situ within the epitaxial deposition chamber. This result may have multiple benefits: the process may be carried out without removing the substrate from the growth chamber, which may be time consuming and potentially exposes the substrate to contamination; the process may be carried out without requiring additional equipment or facilities; and the process can be carried out without significantly reducing material throughput. Furthermore, in particular embodiments of the present invention, the first and second growth processes are carried out without an intervening growth process.

Despite the advantages of performing the etch in-situ, it may be necessary or desirable to remove the substrate from the epitaxial growth chamber and perform the etch in a separate system, particularly if the epitaxial deposition is done in a system other than a CVD system as described above. Thus, the scope of the invention includes both in-situ and ex-situ etching of the epitaxial layer.

In some embodiments, propagation of carrot defects is arrested within a highly doped buffer layer of the epitaxial structure, so that the carrot defects do not extend into more lightly doped layers that may, for example, form the active region of resulting devices. In this manner, the effect of carrot defects on device performance can be reduced or minimized. Moreover, by performing the etch/growth steps within a highly doped buffer layer, any deleterious effects of halting and restarting epitaxial growth may be reduced, minimized or even eliminated. The ensuing epitaxial layers that are primarily responsible for device performance may have a lower defect density as a result of carrot defect termination.

In specific embodiments, silicon carbide epitaxial growth is initiated to grow a highly doped buffer layer of silicon carbide. For example, growth of a silicon carbide epitaxial layer doped with nitrogen, phosphorus, boron and/or aluminum at a concentration of about 1E18 $cm^{-3}$ or greater is initiated by flowing appropriate source gases (e.g. silane, propane and a dopant gas) through a CVD reactor along with a carrier gas. A first layer of silicon carbide is grown to a desired thickness. In some embodiments, the first layer is grown to a thickness of at least about 2.5 microns, however, the first layer may be grown thicker or thinner than 2.5 microns. In a typical embodiment, the first layer is grown to a thickness of about 4 microns. The source gases are then turned off or substantially reduced while the carrier gas continues to flow. While the source gases are shut off, the etchant and/or carrier gas etches the first epitaxial layer to reduce the thickness of the first epitaxial layer. The etchant gas may include $H_2$, HCl, Ar, $Cl_2$ and/or a carbon-containing gas such as propane. In the typical embodiment discussed above, the first epitaxial layer may, for example, be etched as much as about 3 microns. The inventors have found that carrot defects may be arrested when the first epitaxial layer is etched by as little as 0.4 microns.

The flow of source gases is then resumed, and a second epitaxial layer is grown on the first epitaxial layer (or the growth of the first epitaxial layer is resumed). The steps of halting the source gases, etching the grown epitaxial layer and restarting the source gases may be repeated multiple times. After the final etch step, the epitaxial layer may be capped with an additional epitaxial layer that, in some embodiments, includes about 2 microns of silicon carbide. The remainder of the epitaxial layers of the structure may then be grown. It has been found that by stopping the flow of source gases, etching the grown silicon carbide layer and growing additional silicon carbide on the etched surface, the majority of carrot defects propagating through the layer are terminated and do not continue to propagate in the subsequently grown layers.

Referring again to FIG. 4, carrot defect termination is illustrated schematically therein in the case of carrot defect B1. As with carrot defect A1, carrot defect B1 originates at the interface 12 between substrate 10 and epitaxial layer 20. At a predetermined time after the initiation of growth, the flow of source gases is interrupted and growth of epitaxial layer 20 is halted. The epitaxial layer 20 then starts to be etched. After the epitaxial layer 20 is etched slightly, the flow of source gases is resumed at time $t_1$, and growth of epitaxial layer 20 continues until time $t_2$. As illustrated in FIG. 4, the interruption of growth and etching of the epitaxial layer 20 causes carrot defect B1 to terminate at interface 22.

Although carrot defect B1 is still present in epitaxial layer 20, it may no longer affect the electrical characteristics of devices formed in subsequent epitaxial layers because it is terminated within the epitaxial layer 20. Even though a terminated defect such as carrot defect B1 may still give rise to a morphological feature on the surface of the epitaxial layer, the electrical impact of the defect may be minimized or eliminated.

However, in certain embodiments of the present invention, not all carrot defects are eliminated by the method of the invention. For example, as illustrated in FIG. 4, some defects such as carrot defect A1 may continue to propagate through the growth interruption/etch/growth cycle at time $t_1$. Moreover, it is possible for new carrot defects to form after the growth interruption. However, significant reduction in the number of carrot defects that propagate to the surface of the epitaxial layer can be obtained.

Figure 5:
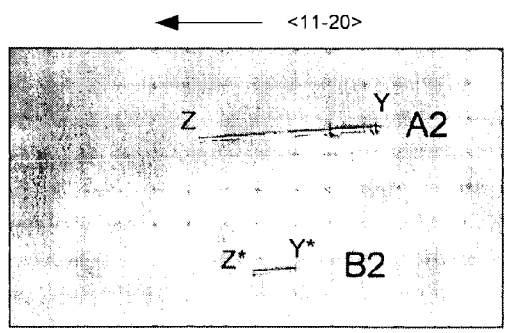
FIG. 5 is a Nomarski micrograph of a pair of carrot defects in a silicon carbide epitaxial layer.

FIG. 5 is a Nomarski micrograph illustrating carrot defect termination according to aspects of the invention. The figure shows the surface of a 40 micron thick epitaxial layer. Two carrot defects are shown in close proximity in FIG. 5. The lower carrot (B2) terminated at a growth interruption after 10 microns of growth. The upper carrot (A2) propagated through the entire 40 micron layer. Again, even though a morphological feature is visible in connection with carrot defect B2, the electrically active portion of the defect does not extend to the surface of the layer. The endpoints Y, Z of defect A2 and endpoints Y*, Z* of defect B2 are labeled for ease of comparison with defects A1 and B1 in the schematic diagram of FIG. 4.

Figure 6:
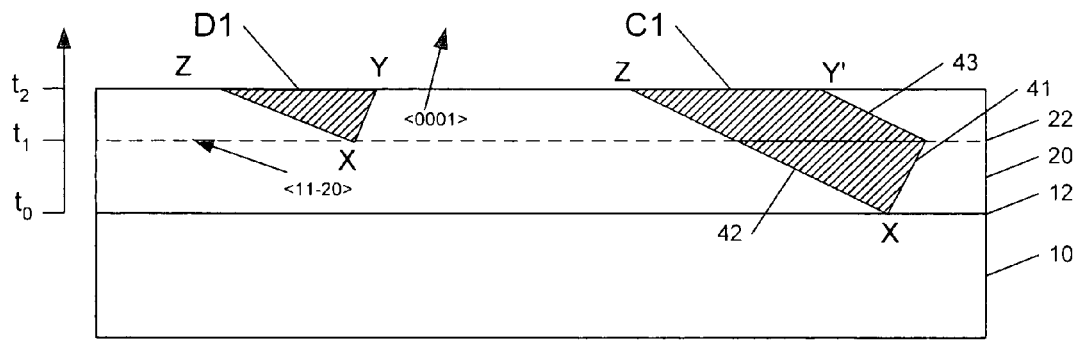
FIG. 6 is a schematic side view of carrot defects formed in a silicon carbide epitaxial layer.

Other defect behavior has been observed. As discussed above, new carrot defects may originate at the growth interruption/etch step, as illustrated by defect D1 in FIG. 6. In addition, as indicated by defect C1 in FIG. 6, the threading dislocation 41 in the [0001] may be converted during the interruption/etch step into a basal plane dislocation 43 which propagates in approximately the [11$\bar{2}$0] direction resulting in the shape illustrated.

The defect behavior described above in connection with carrot defects A1, B1, C1 and D1 is illustrated in the micrographs of FIGS. 7(A), 7(B), 7(C) and 7(D). In the process illustrated in FIGS. 7(A)–(D), a layer of silicon carbide was epitaxially grown on a bulk substrate off-cut at an angle of about eight degrees towards the [11$\bar{2}$0] direction. After 10 microns of growth, the flow of source gases was interrupted, and the layers were etched by about one-half micron. Growth of the epitaxial layer was resumed, and the layer was grown an additional 30 microns. The layer was then etched with molten KOH to highlight defects in the material. FIGS. 7(A)–(D) are micrograph images of the etched layers.

Figure 7A:
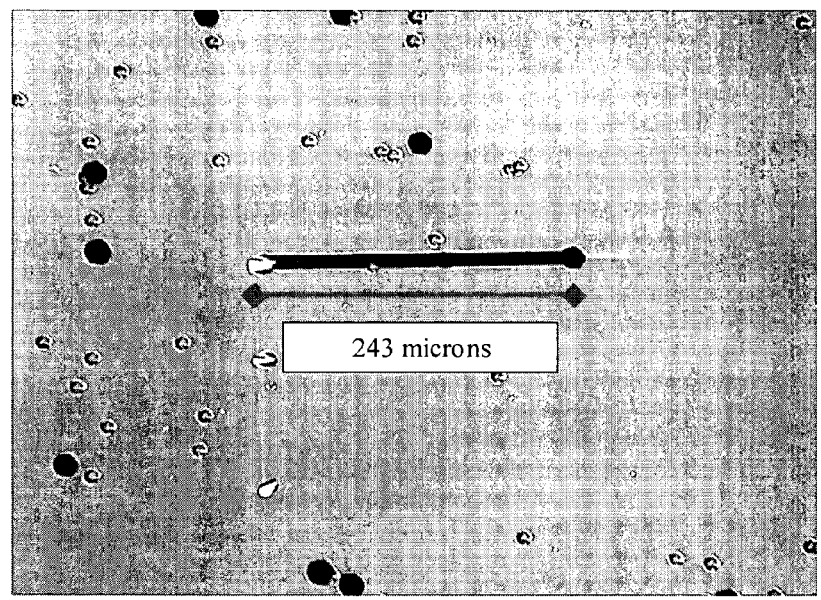
FIGS. 7(A)–(D) are micrographs of carrot defects in silicon carbide layers after KOH etching.

FIG. 7(A) illustrates a carrot defect similar to defect A1 that continued to propagate through the growth interruption/etch step. The carrot defect extended a distance of 243 microns at the surface of the layer.

Figure 7B:
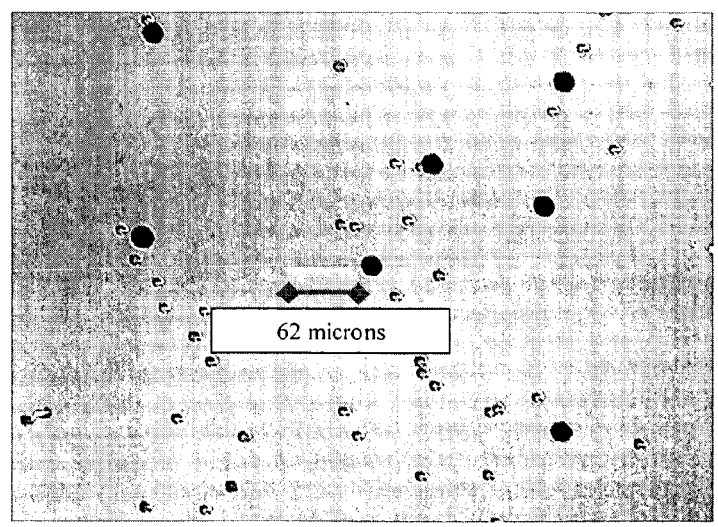

FIG. 7(B) illustrates a carrot defect similar to defect B1 that was terminated at the growth interruption/etch step. The carrot defect grew to a width of 62 microns before termination. It is noteworthy that the KOH etch did not etch a deep trench where the morphological remnant of the carrot appears, which indicates that the prismatic stacking fault did not propagate to the surface of the epitaxial layer.

Figure 7C:
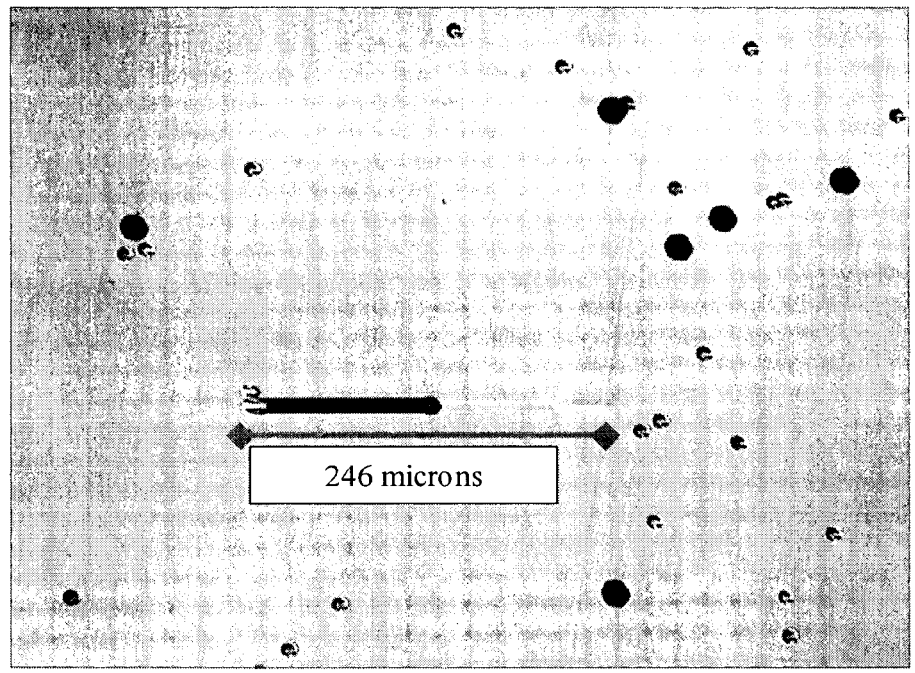

FIG. 7(C) illustrates a carrot defect similar to defect C1 that was modified at the growth interruption/etch step such that the threading dislocation in the [0001] direction was converted to a dislocation propagating in approximately the [11$\bar{2}$0] direction.

Figure 7D:
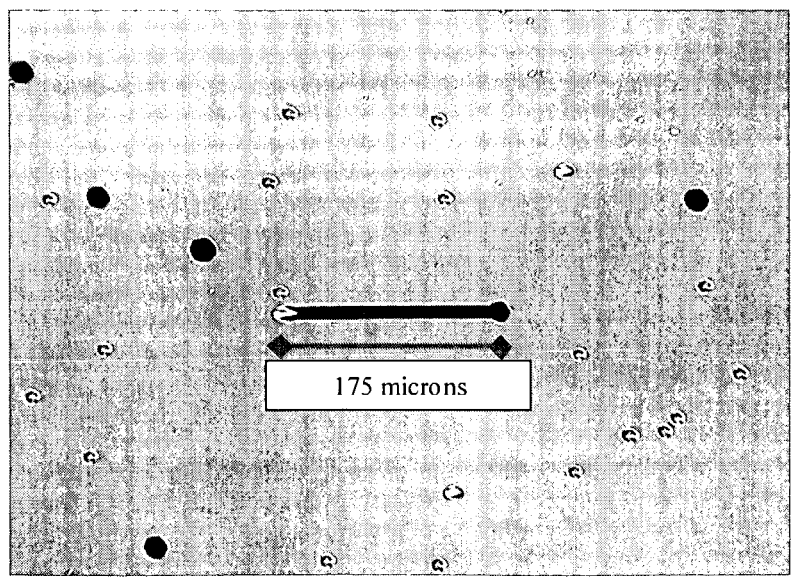
Figure 9:
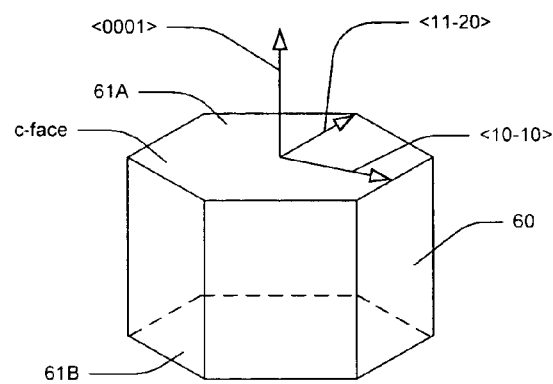
FIG. 9 is a schematic diagram of a hexagonal crystal unit cell structure.
Figure 10:
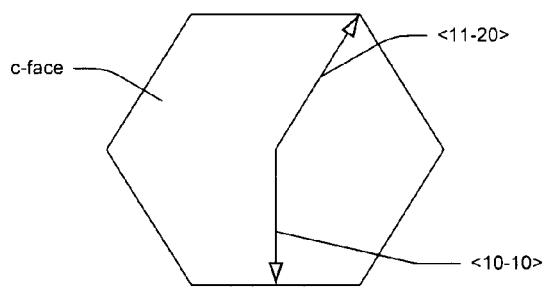
FIG. 10 is a top view of a hexagonal unit cell illustrating standard crystallographic directions.

FIG. 7(D) illustrates a carrot defect similar to defect D1 that originated at the growth interruption/etch step.

To examine the efficacy of the process, nearly identical wafers derived from the same SiC boule ("sister wafers") were processed with and without employing a process according to the invention. The carrot defect densities on each of the wafers were measured and compared. Since the number of carrot defects in a wafer is strongly dependent on the boule, it may be useful to compare carrot defect reduction in wafers taken from the same boule. For this comparison, the inventors calculated the ratio of the number of carrot defects in epilayers grown using the present invention to the number of carrot defects in epilayers grown without the invention, both on sister wafers. In each case, one set of wafers was grown without growth interruption/etching/growth cycle, while one set of wafers included an interruption/etching/growth cycle.

For each growth run, three wafers were loaded into a CVD reactor. The reactor was heated to growth temperature under a flow of carrier gas (H$_2$) only. At a temperature consistent with an etch-rate of approximately 3 microns/hour, growth of silicon carbide was initiated by introduction of silane (SiH$_4$) and propane (C$_3$H$_8$) reactant gases. Appropriate growth temperatures are system dependent and may be determined by a skilled person without undue experimentation.

In the control experiment, this growth was continued until a silicon carbide epitaxial layer of approximately 40 microns had been grown. In other experiments, growth was initiated in the same manner as the control experiment but was interrupted once or twice by stopping the flow of both the silane and propane. During that interruption of about 12 minutes duration, hydrogen in the carrier gas etched about 0.6 microns from the previously grown epitaxial layer. At the end of the growth interruption, silane and propane were reintroduced to resume growing silicon carbide.

In the first experiment, the initial epitaxial layer was approximately 5 microns thick, there was a single growth interruption, and the final epitaxial layer was approximately 35 microns thick. In the second experiment, the initial epitaxial layer was approximately 2.5 microns thick, there was a single growth interruption, and the final epitaxial layer was approximately 37.5 microns thick. In the third experiment, the initial epitaxial layer was approximately 2.5 microns thick, there were two growth interruptions with an additional 2.5 microns thick epitaxial layer between them, and the final epitaxial layer was approximately 35 microns thick. After growth, all of the carrots on each wafer were counted using a Nomarski microscope. The number of carrots on each wafer in the experimental runs was counted and compared to the number of carrots on its sister wafer in the control experiment. For purposes of the experiment, carrot defects were counted if they were not terminated within the epitaxial layer (i.e. if they continued to propagate to the surface). In each case, there was significant reduction in the number of carrot defects.

Figure 8:
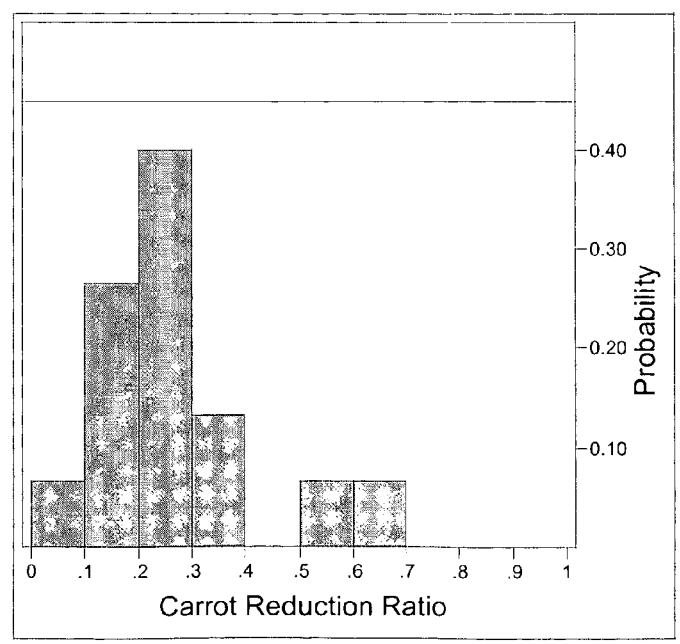
FIG. 8 is a histogram showing the effects of embodiments of the invention.

A histogram of the carrot reduction ratio is presented in FIG. 8. The abscissa (x-axis) of FIG. 8 represents the ratio of carrot defect densities in wafers prepared using a process according to embodiments of the present invention to wafers that did not use such a process. The ordinate (y-axis) represents the percentage of samples falling within the indicated range of defect reduction Thus, FIG. 8 shows that the majority of wafers grown using the inventive process had only 10 to 30% of the number of carrot defects found in the control wafers. The median carrot density was reduced from 2.76 cm$^{-2}$ to 0.67 cm$^{-1}$.

As illustrated in FIG. 8, by using the process described above, the number of carrots can be reduced by roughly 70–80% of the expected value.

While the systems and methods have been described in relation to processes for depositing layers on substrates such as semiconductor wafers, the present invention may be employed in processes for depositing layers or the like on other types of substrates. The systems and methods of the present invention may be particularly useful in processes for forming an epitaxial layer on a substrate.

Various other modifications may be made in accordance with the invention. For example, heating systems may be used other than or in addition to inductive heating.

As used herein a "system" may include one or multiple elements or features. In the claims that follow, the "deposition system", the "deposition control system", the "buffer gas supply system", the "process gas supply system" and the like are not limited to systems including all of the components, aspects, elements or features discussed above or corresponding components, aspects, elements or features.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed:

1. A semiconductor structure comprising a silicon carbide epitaxial layer having a carrot defect which is terminated within the epitaxial layer.

2. A semiconductor structure comprising:
an off-axis silicon carbide substrate;
an epitaxial layer of silicon carbide on the substrate,
a carrot defect having a nucleation point in the vicinity of an interface between the substrate and the epitaxial layer, wherein the carrot defect terminates within the epitaxial layer.

3. A structure according to claim 2, wherein the substrate comprises silicon carbide having a polytype selected from the group consisting of 2H, 4H, and 6H.

4. A structure according to claim 2, wherein the silicon carbide substrate is cut off-axis towards the [11$\bar{2}$0] direction.

5. A structure according to claim 2, wherein the silicon carbide substrate is cut off-axis towards a crystallographic direction perpendicular to the c-axis.

6. A structure according to claim 2, wherein the epitaxial layer comprises a buffer layer.

7. A structure according to claim 2, wherein the epitaxial layer is doped with a dopant at a concentration of 1E18 cm$^{-3}$ or greater.

8. A structure according to claim 7, wherein the dopant comprises nitrogen, phosphorus, boron or aluminum.

9. A structure according to claim 7 wherein the epitaxial layer is a first epitaxial layer, the structure further comprising:
a second epitaxial layer on the first epitaxial layer, the second epitaxial layer having fewer carrots defects therein than the first epitaxial layer.

* * * * *

UNITED STATES PATENT AND TRADEMARK OFFICE
CERTIFICATE OF CORRECTION

| | | |
|---|---|---|
| PATENT NO. | : 7,230,274 B2 | Page 1 of 1 |
| APPLICATION NO. | : 10/790406 | |
| DATED | : June 12, 2007 | |
| INVENTOR(S) | : O'Loughlin et al. | |

It is certified that error appears in the above-identified patent and that said Letters Patent is hereby corrected as shown below:

Column 12, Claim 9, Line 19:  Please correct "carrots"
                                                     To read -- carrot --

Signed and Sealed this

Sixteenth Day of October, 2007

JON W. DUDAS
*Director of the United States Patent and Trademark Office*